(12) United States Patent
Eydelman (10) Patent No.: US 6,727,698 B1
(45) Date of Patent: Apr. 27, 2004

(54) MRI ANTENNAS INCLUDING ELECTRICALLY CONNECTED INNER AND OUTER CONDUCTORS, AND MRI SYSTEMS INCLUDING SUCH ANTENNAS

(75) Inventor: Gregory Eydelman, West Hempstead, NY (US)

(73) Assignee: Fonar Corporation, Melville, NY (US)

( * ) Notice: Subject to any disclaimer, the term of this patent is extended or adjusted under 35 U.S.C. 154(b) by 0 days.

(21) Appl. No.: 09/738,233

(22) Filed: Dec. 15, 2000

Related U.S. Application Data
(60) Provisional application No. 60/172,199, filed on Dec. 17, 1999.

(51) Int. Cl.[7] .................................................. G01V 3/00
(52) U.S. Cl. ....................................... 324/318; 324/322
(58) Field of Search ................................. 324/318, 322

(56) References Cited

U.S. PATENT DOCUMENTS

| | | | |
|---|---|---|---|
| 4,083,006 A | | 4/1978 | Yokoshima |
| 4,373,163 A | | 2/1983 | Vandebult |
| 4,605,899 A | | 8/1986 | Eumurian et al. |
| 4,691,163 A | * | 9/1987 | Blass et al. ................. 324/318 |
| 4,775,837 A | | 10/1988 | Roschmann |
| 4,816,766 A | | 3/1989 | Zabel et al. |
| 4,820,985 A | | 4/1989 | Eash |
| 4,833,409 A | | 5/1989 | Eash |
| 4,835,472 A | | 5/1989 | Zabel et al. |
| 4,839,594 A | * | 6/1989 | Misic et al. ................. 324/318 |
| 4,859,950 A | | 8/1989 | Keren |
| 4,887,038 A | | 12/1989 | Votruba et al. |
| 4,922,204 A | * | 5/1990 | Duerr et al. ................. 324/322 |
| 5,006,805 A | | 4/1991 | Ingwersen |
| 5,050,605 A | | 9/1991 | Eydelman et al. |
| 5,184,076 A | * | 2/1993 | Ehnholm ..................... 324/318 |
| 5,363,113 A | * | 11/1994 | Mametsa et al. ............ 343/744 |
| 5,575,287 A | | 11/1996 | Eydelman |
| 5,583,438 A | | 12/1996 | Eydelman et al. |
| 5,606,259 A | * | 2/1997 | Potthast et al. ............. 324/378 |
| 5,929,639 A | | 7/1999 | Doty |
| 5,939,883 A | | 8/1999 | Green et al. |
| 6,023,166 A | | 2/2000 | Eydelman |
| 6,025,717 A | | 2/2000 | Hertz et al. |
| 6,028,429 A | | 2/2000 | Green et al. |
| 6,107,974 A | | 8/2000 | Votruba et al. |
| 6,284,971 B1 | * | 9/2001 | Atalar et al. ................. 174/36 |

OTHER PUBLICATIONS

Gary X. Shen, et al., "Experimentally Verified, Theoretical Design of Dual–Tuned, Low–Pass Birdcage Radiofrequency Resonators for Magnetic Resonance Imaging and Magnetic Resonance Spectroscopy of Human Brain at 3.0 Tesla", Magnetic Resonance In Medicine, vol. 41, No 2, pp. 268–275, 1999.

P. Elies et al., "Analytical Optimization of the Torque of a Permanent–Magnet Coaxial Synchronous Coupling", IEEE Transactions on Magnetics, vol. 34, No 4, pp. 2267–2273, Jul., 1998.

(List continued on next page.)

Primary Examiner—Diego Gutierrez
Assistant Examiner—Dixomara Vargas
(74) Attorney, Agent, or Firm—Brandon N. Sklar; Kaye Scholer LLP (57) ABSTRACT

An MRI antenna comprises an inner conductor with first and second ends and an outer conductor with first and second ends. The outer conductor substantially surrounds the inner conductor. The inner and outer conductors define a region for receiving a body part and the inner conductor is electrically connected to the outer conductor. The inner and outer conductors may be connected in a variety of manners. For example, the inner conductor may be directly electrically connected to the outer conductor. The inner conductor may also be connected electrically to the outer conductor through one or more capacitors. A magnetic resonance imaging system including the antenna of the present invention is also disclosed.

87 Claims, 6 Drawing Sheets

OTHER PUBLICATIONS

Jeffrey R. Fitzsimmons, et al., "Double Resonant Quadrature Birdcage", Magnetic Resonance in Medicine, vol. 30, pp. 107–114, 1993.

Siew Kan, et al., "Single–Input Double–Tuned Foster–Type Probe Circuit", Magnetic Resonance In Medicine, vol. 26, pp. 7–14, 1992.

K. Derby, et al., "Design and Evaluation of a Novel Dual–Tuned Resonator for Spectroscopic Imaging", Journal of Magnetic Resonance, vol. 86, pp. 645–651, 1990.

J.R. Fitzsimmons, et al., "A Comparison of Double–Tuned Surface Coils", Magnetic Resonance In Medicine, vol. 10, pp. 302–309, 1989.

Nina C. Gonnella, et al., "Design and Construction of a Simple Double–Tuned, Single–Input Surface–Coil Probe", Journal of Magnetic Resonance, vol. 85, pp. 24–34, 1989.

P. Van Hecke, et al., "Double–Tuned Resonator Designs for NMR Spectroscopy", Journal of Magnetic Resonance, vol. 84, pp. 170–176, 1989.

D. Ballon, et al., "Doubly Tuned Solenoidal Resonators for Small Animal Imaging and Spectroscopy at 1.5 Tesla", Magnetic Resonance Imaging, vol. 7, pp. 155–162, 1989.

Jeffrey R. Fitzsimmons, et al., "A Transformer–Coupled Double–Resonant Probe for NMR Imaging and Spectroscopy", Magnetic Resonance in Medicine, vol. 5, pp. 471–477, 1987.

A.B. Macnee, "VHF Amplifiers, Mixers, and Oscillators", Microwave Receivers, Chapter 5, pp. 122–125, S.N. Van Voorhis, editor, Dover Publications, Inc., NY, 1966.

Leland H. Hemming, "Piping", Architectural Electromagnetic Shielding Handbook, Chapter 7.5, pp. 118–124, 1992.

Edward F. Vance, "Coupling to Shielded Cables", John Wiley and Sons, NY, pp. 112–131, 1978.

Stephen A. Maas, "The RF and Microwave Circuit Design Cookbook", Artech House, Boston, pp. 3–17, 1998.

N. Marcuvitz, editor, "Waveguide Handbook", Dover Publications, Inc., N.Y., pp. 66–89, 1951.

Robert L. Shrader, "Electrical Fundamentals for Technicians", Second Edition, McGraw–Hill, Inc., pp. 389–411, 1977.

* cited by examiner

MRI ANTENNAS INCLUDING ELECTRICALLY CONNECTED INNER AND OUTER CONDUCTORS, AND MRI SYSTEMS INCLUDING SUCH ANTENNAS

BENEFIT OF PROVISIONAL APPLICATION

The present application claims the benefit of U.S. Ser. No. 60/172,199, filed on Dec. 17, 1999, assigned to the assignee of the present application and incorporated by reference herein.

RELATED APPLICATIONS

The present application is related to U.S. Ser. No. 09/738,236 and U.S. Ser. No. 09/738,235, both filed on the same day as the present application, assigned to the assignee of the present application and incorporated by reference, herein.

FIELD OF THE INVENTION

This invention relates to radio frequency receiving and transmitting antennas, and, more particularly, to receiving and transmitting radio frequency antennas for use in magnetic resonance imaging.

BACKGROUND OF THE INVENTION

Magnetic resonance imaging ("MRI") is a well known, highly useful technique for diagnosing abnormalities in biological tissue. MRI can detect abnormalities which are difficult or impossible to detect by other techniques, without the use of x-rays or invasive procedures.

MRI uses changes in the angular momentum or spin of the atomic nuclei of certain elements within body tissue in a static magnetic field after excitation by radio frequency energy, to derive images containing useful information concerning the condition of the tissue. During an MRI procedure, the patient is inserted into an imaging volume containing a static magnetic field. The vector of the angular momentum or spin of nuclei containing an odd number of protons or neutrons tends to align with the direction of the magnetic field. A transmitting antenna within the imaging volume emits a pulse or pulses of radio frequency energy having a particular bandwidth of frequency, referred to as the resonant or Larmor frequency, shifting the vectors of the nuclei out of alignment with the applied magnetic field. The spins of the nuclei then turn or "precess" around the direction of the applied primary magnetic field. As their spins precess, the nuclei emit small radio frequency signals, referred to as magnetic resonance ("MR") signals, at the resonant or Larmor frequency, which are detected by a radio frequency receiving antenna tuned to that frequency. The receiving antenna is typically positioned within the imaging volume proximate the patient. Gradient magnetic fields are provided to spatially encode the MR signals emitted by the nuclei. After the cessation of the application of radio frequency waves, the precessing spins gradually drift out of phase with one another, back into alignment with the direction of the applied magnetic field. This causes the MR signals emitted by the nuclei to decay. The MR signals detected by the receiving antenna are amplified, digitized and processed by the MRI system. The same antenna may act as the transmitting and receiving antenna. Hydrogen, nitrogen-14, phosphorous-31, carbon-13 and sodium-23 are typical nuclei detected by MRI. Hydrogen is most commonly detected because it is the most abundant nuclei in the human body and emits the strongest MR signal.

The rate of decay of the MR signals varies for different types of tissue, including injured or diseased tissue, such as cancerous tissue. By known mathematical techniques involving correlation of the gradient magnetic fields and the particular frequency of the radio frequency waves applied at various times with the rate of decay of the MR signals emitted by the patient, it is possible to determine the concentrations and the condition of the environment of the nuclei of interest at various locations within the patient's body. This information is typically displayed as an image with varying intensities, which are a function of the concentration and environment of the nuclei of interest. Typical MRI systems are the Quad 7000 and Quad 12000 available from FONAR Corporation, Melville, N.Y., for example.

The quality of the magnetic resonance image is directly related to the characteristics of the receiving and transmitting antenna. Significant electrical characteristics of the antenna include its sensitivity, Q factor and the signal-to-noise ratio.

Sensitivity is the signal voltage generated in the receiving antenna by MR signals of a particular magnitude. The higher the sensitivity within the region to be imaged, the weaker the signals which can be detected. The sensitivity of the antenna is preferably substantially uniform with respect to MR signals emanating from all volume elements within the region of the subject which is to be imaged.

The Q or quality factor, which is closely related to the sensitivity of the antenna, is a measure of the ability of the antenna to amplify the received signal. The Q-value of the antenna can be lowered by a patient proximate or within an antenna, due to capacitive and to a lessor extent the inductive coupling between the patient and the antenna. Antennas must therefore have a high Q-value when they are unloaded and the Q-value must not become too diminished by the presence of the patient. On the other hand, the coil must couple well with the region of a patient's anatomy which is to be imaged.

Signal-to-noise ("S/N") ratio is the ratio between those components in the electrical impulses appearing at the antenna terminals representing the detected MR signals and the components representing spurious electromagnetic signals in the environment and internally generated thermal noise from the patient. To optimize the S/N ratio, the antenna should have low sensitivity to signals from outside the region to be imaged and to thermal noise. To enhance both S/N ratio and sensitivity, the antenna is "tuned" or arranged to resonate electrically at the frequency of the MR signals to be received (the Larmor frequency), which is typically several megahertz or more. Neither the coil size nor geometry of the antenna can be allowed to create an inductance or self-capacitance which prevents tuning to the desired frequency.

The antenna must also meet certain physical requirements. The antenna should have a high filling factor, which maximizes the amount of tissue which fits within the volume detected by the windings of the coil. The antenna must also fit within the relatively small imaging volumes typically provided for receiving the subject within the magnet assembly, along with other components of the system and the subject. The antenna should not cause significant discomfort to the subject. Additionally, the antenna should be easy to position with respect to the subject, and be relatively insensitive to minor faults in positioning relative to the subject.

These numerous considerations often conflict with one another and therefore must be balanced during the design process.

The sensitivity and S/N ratio of MRI radio frequency antennas have been improved by positioning a first coil, tuned to resonate at the Larmor frequency of the element of interest, proximate the part of the subject which is to be imaged, and positioning a similarly tuned second coil, typically a single loop, adjacent to the first coil. The second coil is connected to the preamplifier of the MRI system. The first and second coils are inductively coupled to each other. MR signals emitted by the patient induce voltages in the first coil, causing current to flow within the coil. The current generates a magnetic field which induces voltage in the second coil. The MR signals may induce voltages in the first coil, as well. The voltages induced in the second coil are processed by the MRI system. Use of two such coils amplifies the MR signals and the filters spurious signals outside of the frequency band of the Larmor frequency. See, for example, U.S. Pat. No. 5,583,438 and U.S. Pat. No. 5,575,287, assigned to the assignee of the present invention.

Radio frequency antenna coils may be used in a variety of configurations. For example, the coil may be receiving coil, as discussed above. The receiving coil may be part of an array of receiving coils, such as in the primary and secondary coil arrangements, discussed above. The receiving coil may also act as the transmitting coil of the MRI system. A pair of receiving coils can also be arranged 90° with respect to each other to enable quadrature detection, which improve the signal-to-noise ratio.

SUMMARY OF THE INVENTION

In accordance with one embodiment of the present invention, an MRI antenna is disclosed comprising an inner conductor with first and second ends and an outer conductor substantially surrounding the inner conductor. The outer conductor also has first and second ends. The inner and outer conductors define a region for receiving a body part and the inner conductor is electrically connected to the outer conductor. The electrical connection may be a direct connection or a capacitive connection through one or more capacitors.

In accordance with another embodiment of the present invention, an MRI antenna is disclosed comprising an inner conductor having first and second ends and an outer conductor having first and second ends. The outer conductor substantially surrounds the inner conductor. The inner conductor and the outer conductor define a region for receiving a body part. The first end of the inner conductor is directly electrically connected to the first end of the outer conductor. The second end of the inner conductor is directly electrically connected to the second end of the outer conductor. The antenna further comprises an output from a node between the connected first ends of the inner and outer conductors and from a node between the connected second ends of the inner and outer conductors.

In accordance with another embodiment of the present invention, an MRI antenna is disclosed comprising an inner conductor having first and second ends and an outer conductor having first and second ends. The outer conductor substantially surrounds the inner conductor. The inner conductor and the outer conductor define a region for receiving a body part. The first end of the inner conductor is connected to the first end of the outer conductor across a first capacitor. The second end of the inner conductor is connected to the second end of the outer conductor across a second capacitor. The inner and outer conductors are tuned to the same frequency. An output of the antenna is provided across the first capacitor.

In accordance with another embodiment of the present invention, an MRI antenna is disclosed comprising an inner conductor having first and second ends and an outer conductor having first and second ends. The outer conductor substantially surrounds the inner conductor and the inner and outer conductors define a region for receiving a body part. The first end of the outer conductor is connected to the second end of the outer conductor across a variable capacitor. The first end of the inner conductor is connected to the first end of the outer conductor across a first capacitor. The second end of the inner conductor is connected to the second end of the outer conductor across a second capacitor. The first and second ends of the inner conductor are connected across a third capacitor, providing an output of the antenna. The inner and outer conductors are tuned to the same frequency.

In accordance with another embodiment of the present invention, an MRI antenna is disclosed comprising an inner conductor having first and second ends and an outer conductor having first and second ends. The outer conductor substantially surrounds the inner conductor and the inner and outer conductors define a region for receiving a body part. The first end of the inner conductor is directly connected to the second end of the outer conductor and the first end of the outer conductor and the second end of the inner conductor are connected across a capacitor, providing an output of the antenna.

Magnetic resonance imaging systems including the antennas of the present invention, are also disclosed.

DETAILED DESCRIPTION OF THE INVENTION

Figure 1:
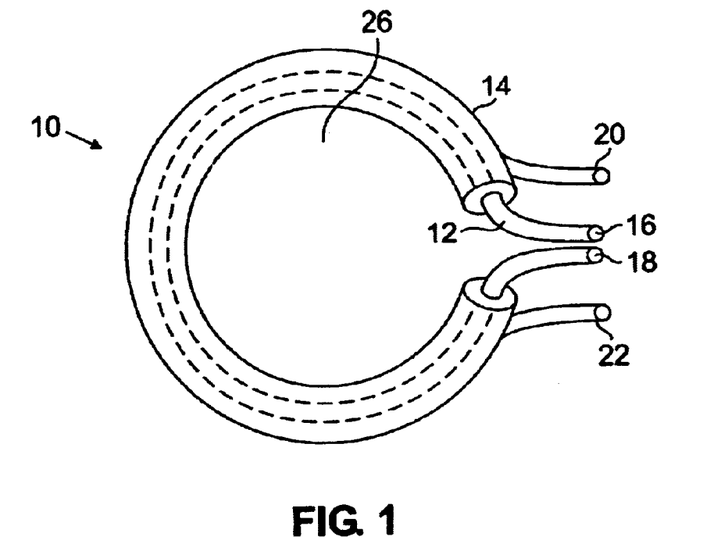
FIG. 1 is a plan view of a basic coaxial cable unit of an MRI antenna in accordance with one embodiment of the present invention.

FIG. 1 is a plan view of a basic coaxial cable unit 10 of an MRI antenna in accordance with one embodiment of the invention. The unit 10 comprises an inner conductor 12 and an outer conductor 14 coaxially arranged, as shown in the cross-sectional view of FIG. 2. The inner conductor 12 and the outer conductor 14 are separated by a dielectric material 24, such as Teflon®, for example, forming the coaxial cable unit 10. The coaxial conductors 12, 14 are inductively coupled to each other. Preferably, the inner and outer conductors 12, 14 are tightly coupled to each other. More preferably, they are critically coupled to each other.

Figure 2:
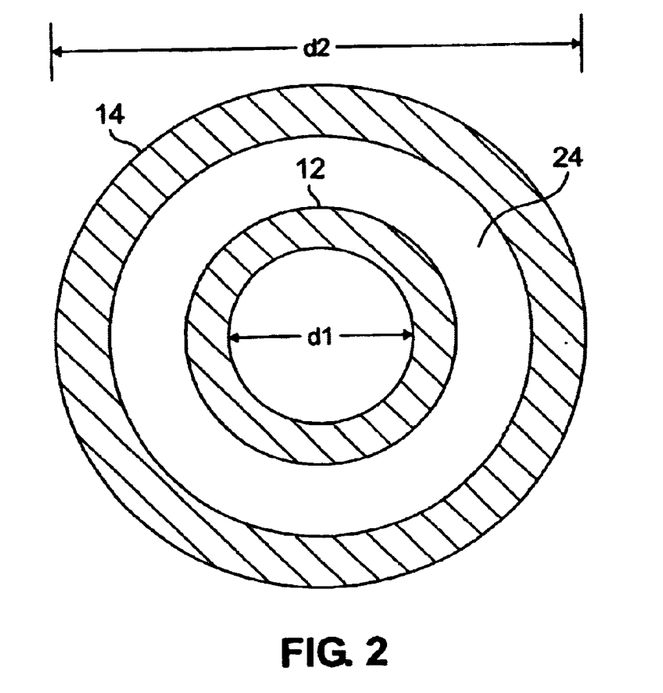
FIG. 2 is a cross-sectional view of the basic coaxial cable unit of FIG. 1.

The inner conductor 12 has two ends 16, 18 and the outer conductor 14 has two ends 20, 22.

A body part to be imaged is received in the region 26 bounded by the coaxial cable unit 10. In FIG. 1, the coaxial conductors are in the shape of a ring. Other shapes may be used, dependent on the body part being imaged.

Each conductor 12, 14 may be copper tubing. The diameter $d_1$ of the inner conductor 12 may be about 0.125 inches, for example. The diameter $d_2$ of the outer conductor 14 may be about 0.25 inches, for example. The wall thickness of each conductor 12, 14 may be about 0.032 inches, for example.

The coaxial cable unit 10 may be formed of soft refrigeration tubing of the appropriate sizes, available from Metal Product, Wynne, Ark. The tubing corresponding to the inner conductor 12 may be covered by a Teflon® tube, such as TFT70C polytetrafluoroethylene, for example, available from AIN Plastics, Inc., Mount Vernon, N.J. The Teflon® covered inner conductor 12 is then inserted through the tubing corresponding to the outer conductor 14, to form the coaxial cable unit 10.

The coaxial cable unit may also be flexible, one quarter inch High Temperature Air Dielectric Coaxial Cable, Andrew HST1-SD Heliax, available from Andrew Corporation, Orland Park, Ill., for example.

Figure 3:
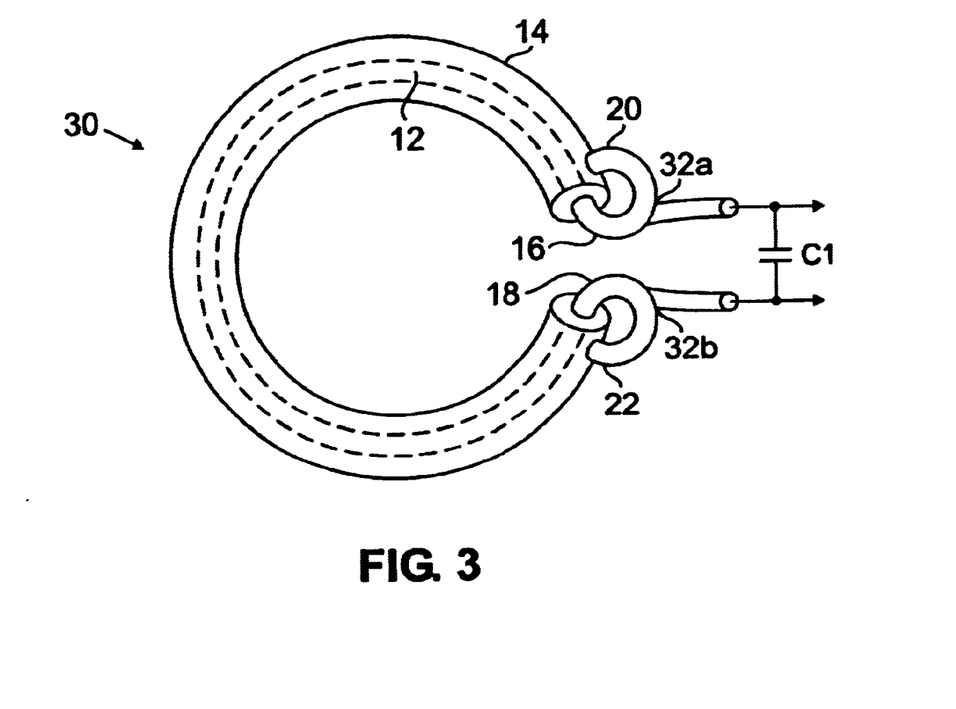
FIG. 3 is a plan view of an antenna in accordance with one embodiment of the present invention.

In one example, an antenna 30 is formed by connecting the ends 16, 18 of the inner conductor 12 to the adjacent ends 20, 22 of the outer conductor 14, as shown in FIG. 3. Common nodes 32a, 32b of the connected outputs ends 16 and 18 and 20 and 22, respectively, are each connected across a capacitor $C_1$ to provide outputs to the antenna 30. The capacitor $C_1$ has a value such that the inner and outer conductors 12, 14 are tuned to the Larmor frequency of the species of interest, such as hydrogen. The capacitor $C_1$ may be connected to a variable capacitor ("varactor") in the preamplifier of the receiver system of an MRI device or may be the varactor in the preamplifier.

Figure 4:
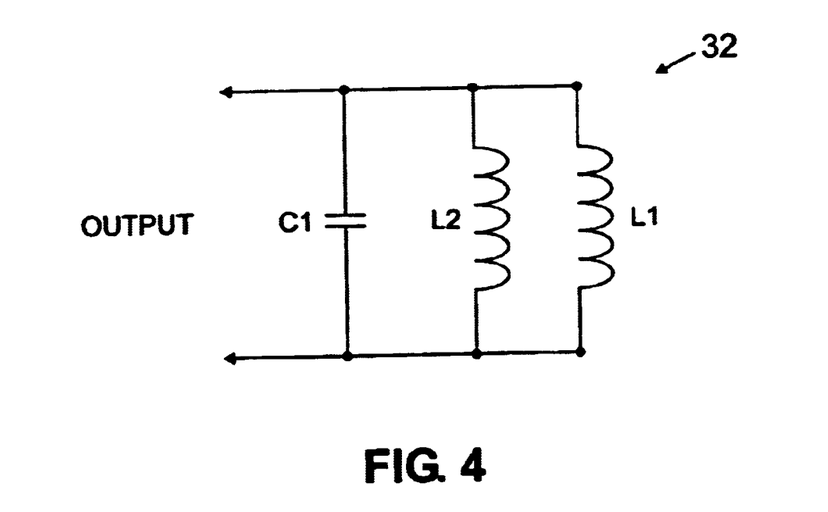
FIG. 4 is a schematic diagram of a circuit corresponding to the antenna of FIG. 3.

FIG. 4 is a schematic diagram of a circuit 32 corresponding to the antenna 30 of FIG. 3. The inner conductor 12 and the outer conductor 14 are each represented as an inductor $L_1$, $L_2$, respectively. The capacitor $C_1$ is shown, as well. The inductors $L_1$, $L_2$ are inductively coupled to each other and the circuit is tuned to the Larmor frequency. The inductors $L_1$, $L_2$ and the capacitor $C_1$ are connected in parallel, thereby decreasing the inductance and decreasing the resistance, as compared to inductors connected in series. Decreasing the inductance and the resistance of the circuit allows for the use of coaxial cable units with larger diameters, at a given resonant frequency. Since high frequency current in the inner conductor 12 and the outer conductor 14 flows in a thin region near the surface of the conductors due to the skin effect, connecting the inner and outer conductors 12, 14 in parallel effectively increases the surface area of the antenna.

Figure 5:
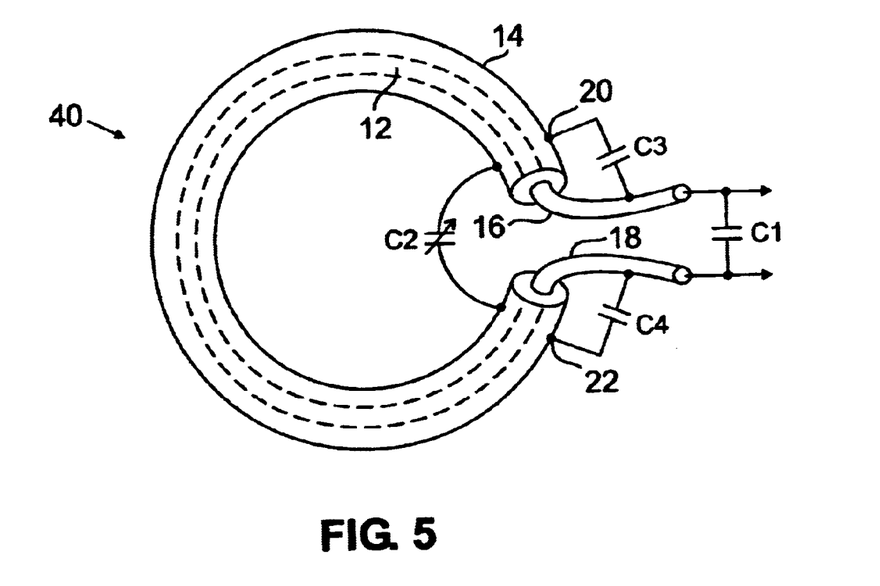
FIG. 5 is a plan view of an antenna in accordance with another embodiment of the present invention.

While a distributive capacitance exists between the inner and the outer conductor, the inner conductor may be capacitively connected to the outer conductor, as well. As shown in FIG. 5, the first end 16 of the inner conductor 12 may also be connected to the adjacent, first end 20 of the outer conductor 14 through a capacitor $C_3$ and the second end 18 of the inner conductor 12 may be connected to the adjacent, second end of the outer conductor 22 through a capacitor $C_4$, to form an antenna 40. In addition, the outputs 20, 22 of the outer conductor 18 are connected through a variable capacitor $C_2$, for tuning the outer conductor 14. The ends 16, 18 also provide an output of the antenna 40, which may be connected to the varactor of the preamplifier of the MRI system or may be the varactor, for tuning the inner conductor 12.

Figure 6:
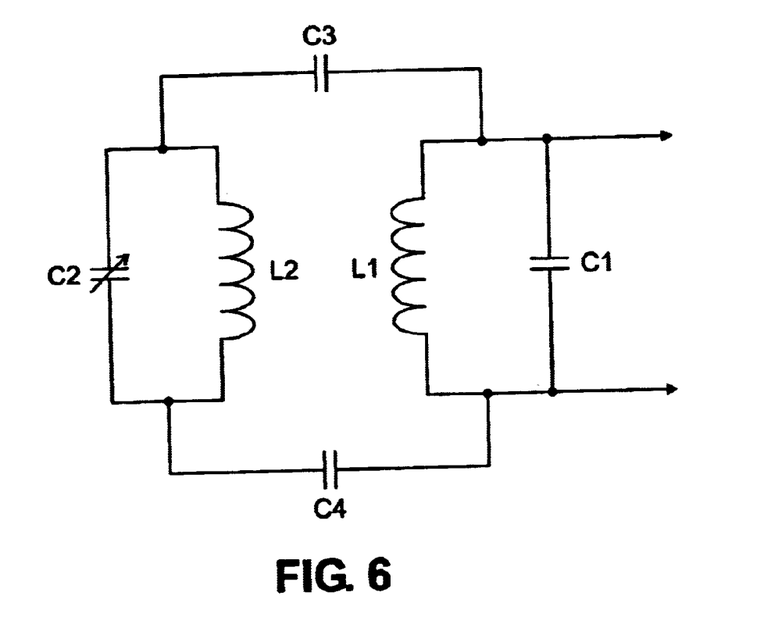
FIG. 6 is a schematic diagram of the antenna of FIG. 5.

FIG. 6 is a schematic diagram of the antenna 50 of FIG. 5, wherein the inductor $L_1$ corresponds to the inner conductor 12 and the inductor $L_2$ corresponds to the outer conductor 14. The capacitors in FIG. 5 and FIG. 6 are commonly identified.

The inner conductor 12 ($L_1$) is shielded from direct reception of the MR signals by the outer conductor 14 ($L_2$). However, the voltages induced in the outer conductor 14 induce voltages in the inner conductor 12. The outer conductor 14 ($L_2$) may, therefore, be treated as a primary winding of a transformer while inner conductor 12 ($L_1$) may be treated as a secondary winding of the transformer. The two circuits including the inner conductor 12 ($L_1$) and the outer conductor 14 ($L_2$) are tuned to the same, Larmor frequency, forming anti-resonant or parallel resonant, double-tuned circuits. The circuits form a bandpass network which filters frequencies outside of the bandpass of the two circuits. The bandpass of the circuit including the inner conductor 12 ($L_1$) is narrower than the bandpass of the circuit including the outer conductor 14 ($L_2$), as is known in the art. Noise and other signals outside of the narrower bandwidth of the inner conductor 12 ($L_1$) are therefore further filtered. Since the inner conductor 12 ($L_1$) is connected t the receiver subsystem of the MRI device, highly filtered signals are provided for analysis. The capacitive coupling between the inner conductor 12 and the outer conductor 14 through the capacitors C3 and C4 reduces the eddy currents in the antenna 40, as compared to the antenna 30.

The outer conductor 14 also shields the inner conductor 12 from capacitive coupling with the body of the patient over most of its length.

Figure 7:
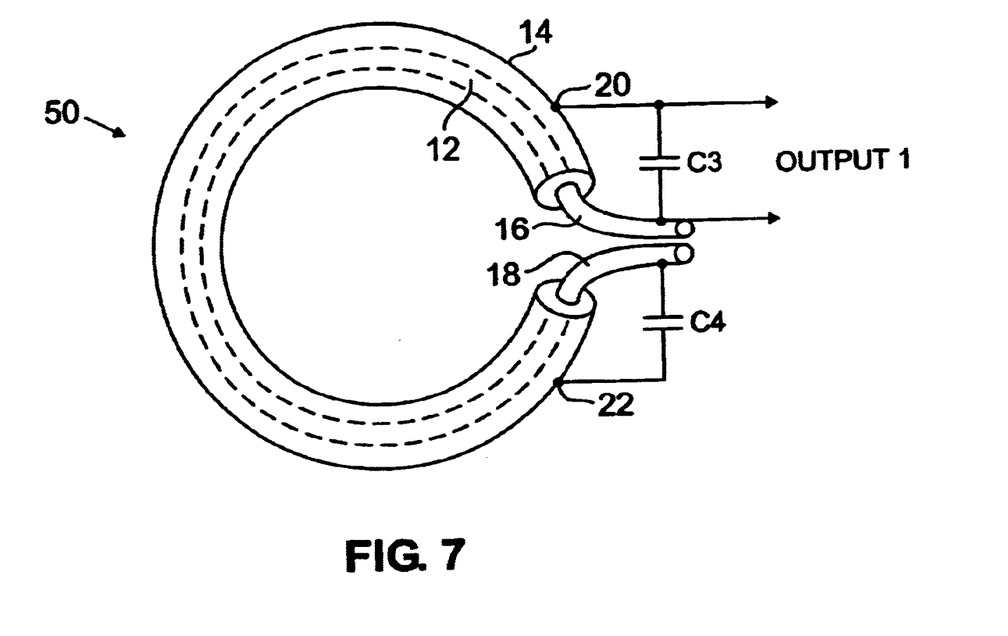
FIG. 7 is a plan view of an antenna in accordance with another embodiment of the present invention.

It is not necessary to provide the tuning capacitor $C_2$ in the antenna 40 of FIG. 5. In FIG. 7, an antenna 50 is shown with the first end 16 of the inner conductor 12 connected to the first, adjacent end 20 of the outer conductor 14 through the capacitor $C_3$. The second end 18 of the inner conductor 12 is connected to the second end 22 of the outer conductor 14 through either the capacitor $C_4$, as shown in FIG. 7, or through a direct connection, dependent upon the field strength of the magnet. In this example, the ends 16 and 20 provide an output of the antenna 50, which may be connected to the varactor in the preamplifier or may be the varactor in the preamplifier.

Figure 8A:
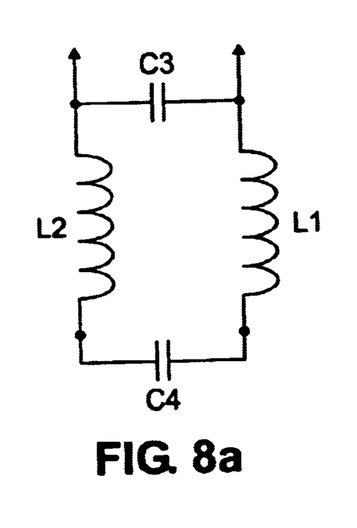
FIG. 8a is a schematic diagram of the antenna of FIG. 8b, tuned to a high Larmor frequency for use in MRI systems with magnets having high field strengths.
Figure 8B:
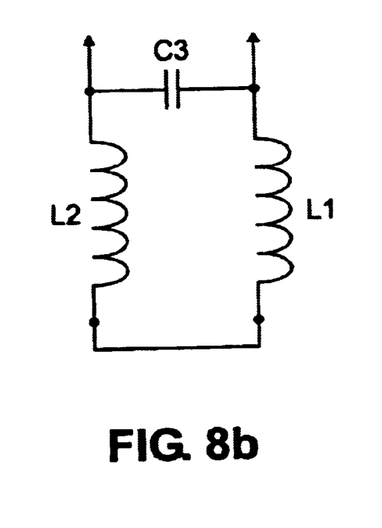
FIG. 8b is a schematic diagram of the antenna of FIG. 7, tuned to a low Larmor frequency for use in MRI systems with magnets having field strengths less than 6,000 Gauss.

FIG. 8a is a schematic diagram of the antenna of FIG. 8b, tuned to a high Larmor frequency for use in MRI systems with magnets having high field strengths (over 6,000 Gauss). At high frequencies, the inductors $L_1$, $L_2$, corresponding to the inner conductor 12 and the outer conductor 14, respectively, are electrically connected in parallel across the two capacitors $C_3$ and $C_4$.

FIG. 8b is a schematic diagram of the antenna of FIG. 7, tuned to a low Larmor frequency for use in MRI systems with magnets having field strengths less than 6,000 Gauss. Here, the parallel connected inductors $L_1$, $L_2$ are connected across only one capacitor $C_3$.

Figure 9:
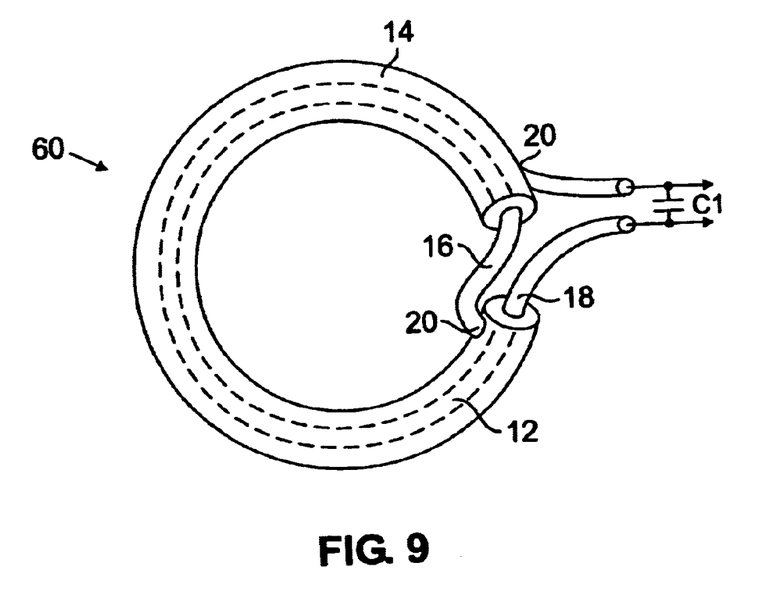
FIG. 9 is a plan view of an antenna in accordance with another embodiment of the present invention.

In another embodiment, an antenna 60 may be formed by connecting a first end 16 of the inner conductor 12 to an opposing end 22 of the outer conductor 14, forming a ring with two turns, as shown in FIG. 9. The second end 18 of the inner conductor 12 and the first end 20 of the outer conductor 14 are connected across a variable capacitor $C_1$ to provide the output of the antenna 60. As above, the capacitor $C_1$ may be a varactor in the preamplifier of the MRI device and the antenna 60 is tuned to the Larmor frequency of the species of interests.

Figure 10:
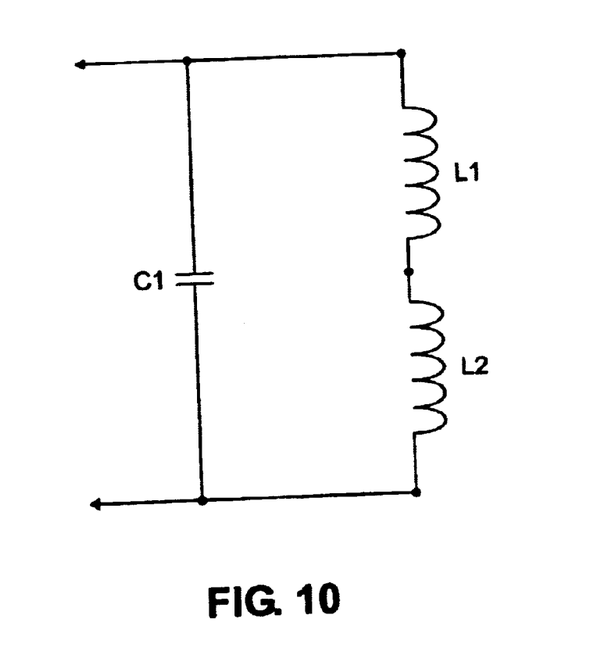
FIG. 10 is a schematic diagram of a circuit corresponding to the antenna of FIG. 9.

FIG. 10 is a schematic diagram of a circuit corresponding to the antenna of FIG. 9. The inner conductor 14 and the outer conductor 12 are each represented as an inductor $L_1$, $L_2$, respectively, electrically connected in series. The series connected inductors L1, L2 are connected in parallel to the capacitor $C_1$.

A ring with two windings outputs MRI signals to the MRI system having an amplitude $\sqrt{2}$ times greater than the amplitude of the output of a corresponding antenna having a single winding. In addition, the inductance of the circuit increases by nearly the square of the number of turns, increasing the Q of the antenna.

The coaxial cable units described above may be encased in a support (not shown) of a rigid dielectric material, such as the fire resistant polymers polyvinyl chloride polytetrafluorethylene and fluorinated ethylene propylene. Polymers having low dielectric constants are particularly preferred. Depending on the body part to be examined, the coaxial rings and support may be connected to a flat plate which rests on the patient table positioned within the gap of the MRI magnet, also as is known in the art. A strap may also be provided to restrain movement of the body part during imaging.

Flexible coaxial cable units, as described above, can also be supported by a flexible belt. The belt may comprise a foam of crosslinked polyethythylene, available from Contour Fabricators, Inc., Grand Blanc, Mich., for example.

The coaxial cable units of the present invention may be part of a quadrature antenna system, by providing an additional receiving coil perpendicular to the coaxial cable unit. The receiving coil may be a coaxial cable unit, well. Examples of quadrature systems are described in U.S. Ser. No. 09/738,235, filed on the same day as the present application, assigned to the assignee of the present application and incorporated by reference herein.

Figure 11:
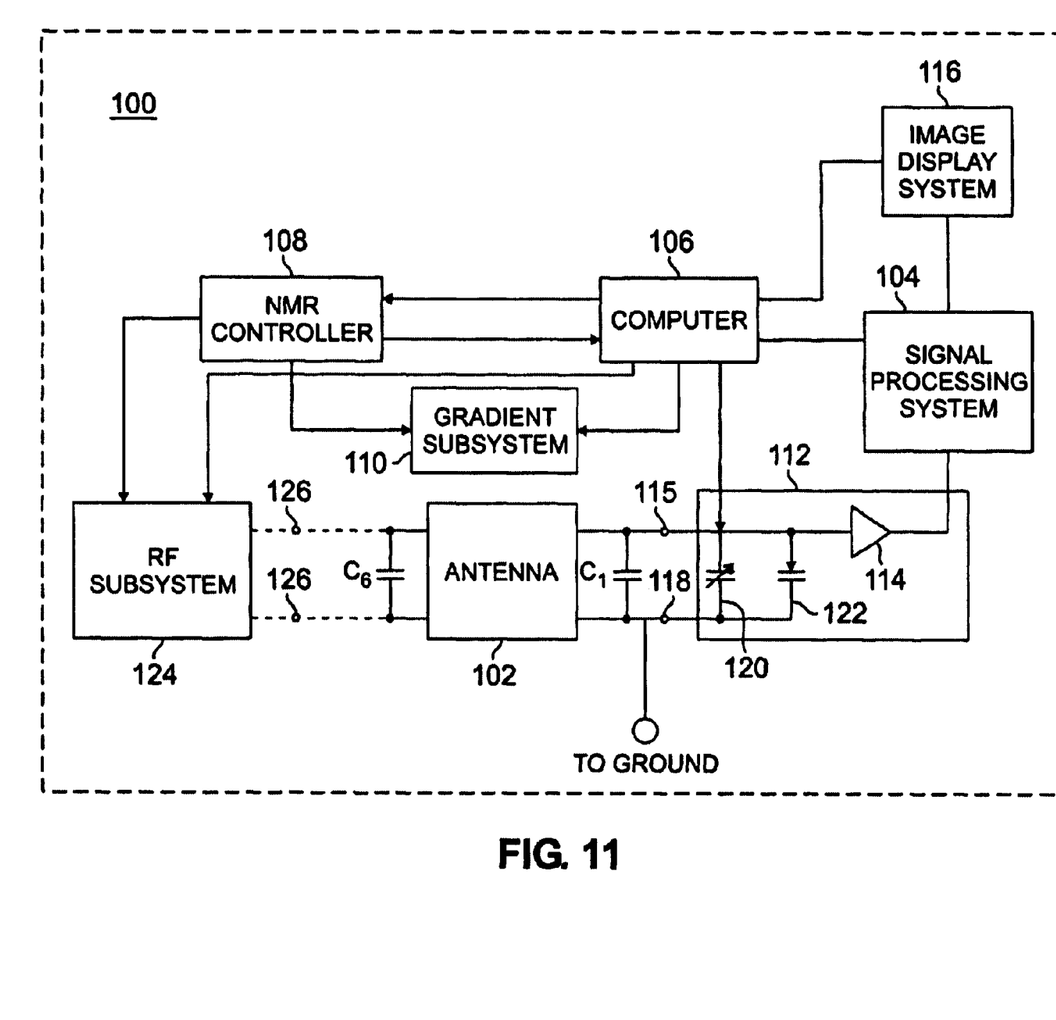
FIG. 11 is a schematic representation of portions of an MRI system, showing in particular a connection between an antenna in accordance with the present invention with certain components of the MRI system.

FIG. 11 is a schematic representation of portions of an MRI system 100, showing in particular a connection between an antenna or antenna array 102 in accordance with the present invention with certain components of the MRI system. A signal processing system 104, a computer 106, an NMR controller 108, a gradient coil subsystem 110, a receiver subsystem 112 including a preamplifier 116, and an image display system 116 of the MRI system 100 are also shown. The computer 106 controls the overall operation of the MRI system 100. The NNR controller 108 stores the timing of the scanning sequences and controls the implementation of the scanning sequence. The signal processing system 104 typically includes a variable amplifier, a frequency down converter, an analog-to-digital converting array and a digital data processor (not shown), as is known in the art. The gradient coil subsystem 110 includes the gradient coils and a gradient waveform generator, which outputs particular waveforms for the selected scanning sequence to the gradient coils, under the control of the NMR controller 108, as is known in the art. The particular ends of the inner conductor of the coaxial cable unit providing the output of the antenna array 102 are connected to the receiver subsystem 112 through the port 118.

As discussed above, the presence of a patient provides a load on the antenna array 102 which lowers the antenna's Q. The presence of the patient also shifts the resonant frequency of the antenna array 102, which may require retuning to the desired Larmor frequency. A varactor, or variable capacitor 120 is therefore preferably provided between the capacitor $C_1$ of the antenna 102 and the preamplifier 114, parallel to the capacitor $C_1$, to enable retuning of the antenna array 102 when the antenna array is positioned with respect to the patient, as is known in the art. Alternatively, $C_1$ may be a varactor. A back diode 122 is preferably provided parallel to the varactor 120 to prevent the passage of excessive voltage to the preamplifier 116, also as is known in the art. Voltage greater than about 0.7 volts is typically blocked by the back diode 122. The varactor 120 is controlled by the computer 106. The port 118 may be connected to the varactor 120, back diode 552 and preamplifier 110 through a short, low capacitance cable, or other appropriate means.

A more complete description of the structure and operation of the MRI system may be found in U.S. Pat. No. 6,025,717, assigned to the assignee of the present invention and incorporated by reference, herein.

The above embodiments are examples of antennas and magnetic resonance imaging systems in accordance with the present invention. It will be recognized by those skilled in the art that changes may be introduced to those embodiments without going beyond the scope of the invention, which is defined by the claims, below.

I claim:

1. An MRI antenna, comprising:
   an inner conductor with first and second ends; and
   an outer conductor having first and second ends proximate the first and second ends of the inner conductor, respectively, the outer conductor substantially surrounding the inner conductor from proximate the first end of the inner conductor to proximate the second end of the inner conductor the outer conductor being electrically continuous between the first and second ends of the outer conductor;
   wherein the ends of the inner conductor are electrically connected to the ends of the outer conductor, forming a closed circuit including the first and second ends of the inner and outer conductors.

2. The MRI antenna of claim 1, wherein the inner conductor is directly electrically connected to the outer conductor.

3. The MRI antenna of claim 1, wherein the inner conductor is electrically connected to the outer conductor across a capacitor.

4. The MRI antenna of claim 3, comprising:
   a first capacitor between the first end of the inner conductor and the first end of the outer conductor and a second capacitor between the second end of the inner conductor and the second end of the outer conductor.

5. The MRI antenna of claim 4, wherein an output of the antenna is provided across the first capacitor.

6. The MRI antenna of claim 4, wherein the first end of the outer conductor is connected to the second end of the outer conductor across a variable capacitor.

7. The MRI antenna of claim 6, wherein the first and second ends of the inner conductor are connected across a capacitor to provide outputs of the antenna.

8. The MRI antenna of claim 1, wherein the first end of the inner conductor and the first end of the outer conductor are adjacent, and the second end of the inner conductor and the second end of the outer conductor are adjacent;

the inner conductor being electrically connected to the outer conductor through a direct connection of the first end of the inner conductor to the first end of the outer conductor, and a direct connection of the second end of the inner conductor to the second end of the outer conductor.

9. The MRI antenna of claim 8, further comprising an output across a node between the connected first ends of the inner and outer conductors and a node between the connected second ends of the inner and outer conductors.

10. The MRI antenna of claim 8, further comprising a capacitor connected across the nodes.

11. The MRI antenna of claim 1, wherein the first end of the inner conductor is directly electrically connected to the second end of the outer conductor and an output of the antenna is provided across the first end of the outer conductor and the second end of the inner conductor.

12. The MRI antenna of claim 11, further comprising a capacitor connected across the first end of the outer conductor and the second end of the inner conductor.

13. The MRI antenna of claim 1, wherein the closed circuit is tunable to a frequency.

14. The MRI antenna of claim 1, wherein:
the outer conductor shields the inner conductor from direct reception of magnetic resonance signals; and
the inner and outer conductors are inductively coupled during operation.

15. The MRI antenna of claim 14, further comprising:
a first closed circuit including the outer conductor; and
a second closed circuit including the inner conductor;
wherein the first and second closed circuits are electrically connected to form a third closed circuit.

16. The MRI antenna of claim 15, wherein the first and second closed circuits are electrically connected across at least one capacitor.

17. The MRI antenna of claim 16, wherein the third closed circuit defines a bandpass filter.

18. The antenna of claim 1, wherein the outer conductor extends continuously between the first and second ends of the outer conductor.

19. An MRI antenna, comprising:
an inner conductor having first and second ends; and
an outer conductor having first and second ends proximate the first and second ends of the inner conductor, respectively, the outer conductor being electrically continuous between the first and second ends of the outer conductor;
the outer conductor substantially surrounding the inner conductor;
wherein the first end of the inner conductor is directly, non-capacitively, electrically connected to the first end of the outer conductor, and
the second end of the inner conductor is directly, non-capacitively, electrically connected to the second end of the outer conductor; and
the antenna further comprising a capacitor connecting a node between the connected first ends of the inner and outer conductors and a node between the connected second ends of the inner and outer conductors, thereby forming a closed circuit including the first and second ends of the inner and outer conductors,
wherein an output of the antenna is provided across the capacitor.

20. The MRI antenna of claim 19, wherein the closed circuit is tunable to a frequency by the capacitor.

21. The antenna of claim 19, wherein the outer conductor extends continuously between the first and second ends of the outer conductor.

22. An MRI antenna, comprising:
an inner conductor having first and second ends; and
an outer conductor having first and second ends proximate the first and second ends of the inner conductor, the outer conductor being electrically continuous between the first and second ends of the outer conductor;
the outer conductor substantially surrounding the inner conductor,
wherein:
the first end of the inner conductor is connected to the first end of the outer conductor across a first capacitor, and
the second end of the inner conductor is connected to the second end of the outer conductor across a second capacitor,
thereby forming a closed circuit including the first and second ends of the inner and outer conductors, the closed circuit being tunable to a frequency, and
an output of the antenna is provided across the first capacitor.

23. The MRI antenna of claim 22, wherein:
the outer conductor shields the inner conductor from direct reception of magnetic resonance signals; and
the inner and outer conductors are inductively coupled during operation.

24. The MRI antenna of claim 23, further comprising:
a first closed circuit including the outer conductor; and
a second closed circuit including the inner conductor;
wherein the first and second closed circuits are electrically connected to form a third closed circuit.

25. The MRI antenna of claim 24, wherein the first and second closed circuits are electrically connected across at least one capacitor.

26. The MRI antenna of claim 25, wherein the third closed circuit defines a bandpass filter.

27. The MRI antenna of claim 22, wherein the closed circuit is tunable to the frequency by the first and second capacitors.

28. The antenna of claim 22, wherein the outer conductor extends continuously between the first and second ends of the outer conductor.

29. An MRI antenna, comprising:
an inner conductor having first and second ends; and
an outer conductor having first and second ends proximate the first and second ends of the inner conductor, the outer conductor being electrically continuous between the first and second ends of the outer conductor;
the outer conductor substantially surrounding the inner conductor;
wherein:
the first end of the outer conductor is connected to the second end of the outer conductor across a variable capacitor, forming a first closed circuit;
the first and second ends of the inner conductor are connected across a capacitor, forming a second closed circuit and providing an output of the antenna,
the first and second closed circuits are tunable to the same frequency; and
further wherein:
the first end of the inner conductor is connected to the first end of the outer conductor across a first capacitor, and the second end of the inner conductor is connected to the second end of the outer conductor across a second capacitor, forming a closed circuit comprising the first and second closed circuits.

30. The MRI antenna of claim 29, wherein:
the outer conductor shields the inner conductor from direct reception of magnetic resonance signals; and
the inner and outer conductor are inductively coupled during operation.

31. The MRI antenna of claim 30, further comprising:
a first closed circuit including the outer conductor; and
a second closed circuit including the inner conductor;
wherein the first and second closed circuits are electrically connected to form a third closed circuit.

32. The MRI antenna of claim 31, wherein the first and second closed circuits are electrically connected across at least one capacitor.

33. The MRI antenna of claim 32, wherein the third closed circuit defines a bandpass filter.

34. The antenna of claim 29, wherein the outer conductor extends continuously between the first and second ends of the outer conductor.

35. An MRI antenna, comprising:
an inner conductor having first and second ends; and
an outer conductor having first and second ends proximate the first and second ends of the inner conductor, the outer conductor being electrically continuous between the first and second ends;
the outer conductor substantially surrounding the inner conductor;
wherein the first end of the inner conductor is directly, non-capacitively, electrically connected to the second end of the outer conductor and the first end of the outer conductor and the second end of the inner conductor are connected across a capacitor, forming a closed circuit including the first and second ends of the inner and outer conductors, and providing an output of the antenna.

36. The MRI antenna of claim 35, wherein the closed circuit is tunable to a frequency.

37. The antenna of claim 35, wherein the outer conductor extends continuously between the first and second ends of the outer conductor.

38. A magnetic resonance imaging (MRI) system, comprising:
a receiver subsystem; and
an antenna connected to the receiver subsystem, the antenna comprising:
an inner conductor with first and second ends; and
an outer conductor substantially surrounding the inner conductor, the outer conductor having first and second ends proximate the first and second ends of the inner conductor, the outer conductor being electrically continuous between the first and second ends;
wherein ends of the inner conductor are electrically connected to the first and second ends of the outer conductor,
forming a closed circuit including the first and second ends of the inner and outer conductors.

39. The MRI system of claim 38, wherein the inner conductor is directly electrically connected to the outer conductor.

40. The MRI system of claim 38, wherein the inner conductor is electrically connected to the outer conductor across a capacitor.

41. The MRI system of claim 40, comprising;
a first capacitor between the first end of the inner conductor and the first end of the outer conductor and a second capacitor between the second end of the inner conductor and the second end of the outer conductor.

42. The MRI system of claim 41, wherein the antenna is connected to the receiver subsystem across the first capacitor.

43. The MRI system of claim 41, wherein the first end of the outer conductor is connected to the second end of the outer conductor across a variable capacitor.

44. The MRI system of claim 43, wherein the first and second ends of the inner conductor are connected across a capacitor to the receiver subsystem.

45. The MRI system of claim 28, wherein the first end of the inner conductor and the first end of the outer conductor are adjacent, and the second end of the inner conductor and the second end of the outer conductor are adjacent;
the inner conductor being electrically connected to the outer conductor through a direct connection of the first end of the inner conductor to the first end of the outer conductor, and a direct connection of the second end of the inner conductor to the second end of the outer conductor.

46. The MRI system of claim 45, wherein a node between the connected first ends of the inner and outer conductors and a node between the connected second ends of the inner and outer conductors are connected to the receiver subsystem.

47. The MRI antenna of claim 46, further comprising a capacitor connected across the nodes.

48. The MRI system or claim 38, wherein the first end of the inner conductor is directly electrically connected to the second end of the outer conductor and the first end of the outer conductor and the second end of the inner conductor are connected to the receiver subsystem.

49. The MRI antenna of claim 48, further comprising a capacitor connected across the first end of the outer conductor and the second end of the inner conductor.

50. The MRI system of claim 38, wherein the closed circuit is tunable to the same frequency.

51. The antenna of claim 38, wherein the outer conductor extends continuously between the first and second ends of the outer conductor.

52. An MRI antenna, comprising:
a coaxial cable unit comprising an inner conductor and an outer conductor;
wherein:
the inner conductor has first and second ends;
the outer conductor has first and second ends adjacent to the first and second ends of the inner conductor, respectively, the outer conductor being electrically continuous between the first and second ends;
the inner conductor is electrically connected to the outer conductor, forming a closed circuit including the first and second ends of the inner and outer conductors; and
the coaxial cable unit is shaped to bound a region to receive a body part, whereby a circumference around the body part is surrounded by the coaxial cable unit when the body part is received in the region.

53. The MRI antenna of claim 52, wherein:
the outer conductor shields the inner conductor from direct reception of magnetic resonance signals; and
the inner and outer conductors are inductively coupled during operation.

54. The MRI antenna of claim 53, further comprising:
a first closed circuit including the outer conductor; and
a second closed circuit including the inner conductor;
wherein the first and second closed circuits are electrically connected to form a third closed circuit.

55. The MRI antenna of claim 54, wherein the first and second closed circuits are electrically connected across at least one capacitor.

56. The MRI antenna of claim 55, wherein the third closed circuit defines a bandpass filter.

57. The MRI antenna of claim 52, wherein:
the first end of the inner conductor is directly electrically connected to the first end of the outer conductor;
the second end of the inner conductor is directly electrically connected to the second end of the outer conductor;
a capacitor connected across a node between the connected first ends of the inner and outer conductors and a node between the connected second ends of the inner and outer conductors such that the capacitor, the first conductor and the second conductor are connected in parallel;
A wherein an output of the antenna is provided across the capacitor.

58. The MRI antenna of claim 52, wherein the first end of the inner conductor is connected to the first end of the outer conductor across a first capacitor.

59. The MRI antenna of claim 58, wherein an output of the antenna is provided across the first capacitor.

60. The MRI antenna of claim 59, wherein the second end of the inner conductor is connected to the second end of the outer conductor across a second capacitor.

61. The MRI antenna of claim 58, wherein the second end of the inner conductor is connected to the second end of the outer conductor across a second capacitor.

62. The MRI antenna of claim 61, further comprising:
a variable capacitor connecting the first end of the outer conductor to the second end of the outer conductor;
an output of the antenna is provided from the first and second ends of the inner conductor.

63. The MRI antenna of claim 62, further comprising a third capacitor connecting the first end of the inner conductor to the second end of the inner conductor.

64. The MRI antenna of claim 52, wherein:
the first end of the inner conductor is directly electrically connected to the second end of the outer conductor; and
the second end of the inner conductor is connected to the first end of the outer conductor across a capacitor, providing an output of the antenna.

65. The MRI antenna of claim 52, wherein the inner and outer conductors are connectable to form a circuit tunable to a frequency.

66. An MRI antenna, comprising:
a coaxial cable unit comprising an inner conductor and an outer conductor;
the inner and the outer conductors each having first and second ends, respectively;
the inner and outer conductors each extending continuously between the respective first and second ends;
wherein ends of the inner conductor are electrically connected to ends of the outer conductor to form a closed circuit, and
the coaxial cable unit is shaped to bound a region.

67. The MRI antenna of claim 66, wherein:
the outer conductor shields the inner conductor from direct reception of magnetic resonance signals; and
the inner and outer conductor are inductively coupled during operation.

68. The MRI antenna of claim 67, further comprising:
a first closed circuit including the outer conductor; and
a second closed circuit including the inner conductor;
wherein the first and second circuits are electrically connected to form a third closed circuit.

69. The MRI antenna of claim 68, wherein the first and second closed circuits are electrically connected across at least one capacitor.

70. The MRI antenna of claim 69, wherein the third closed circuit defines a bandpass filter.

71. The MRI antenna of claim 66, wherein:
the inner conductor has first and second ends;
the outer conductor has first and second ends adjacent to the first and second ends of the inner conductor, respectively;
the first end of the inner conductor is directly electrically connected to the first end of the outer conductor;
the second end of the inner conductor is directly electrically connected to the second end of the outer conductor;
an output across a node between the connected first ends of the inner and outer conductors and a node between the connected second ends of the inner and outer conductors; and
a capacitor connected across the first and second nodes, such that the capacitor, the first conductor and the second conductor are connected in parallel.

72. The MRI antenna of claim 71, wherein:
the first end of the inner conductor is directly electrically connected to the second end of the outer conductor; and
the second end of the inner conductor is connected to the first end of the outer conductor across a capacitor, providing an output of the antenna.

73. The MRI antenna of claim 66, wherein:
the inner conductor has first and second ends;
the outer conductor has first and second ends adjacent to the first and second ends of the inner conductor, respectively; and
the first end of the inner conductor is connected to the first end of the outer conductor across a first capacitor.

74. The MRI antenna of claim 73, wherein an output of the antenna is provided across the first capacitor.

75. The MRI antenna of claim 74, wherein the second end of the inner conductor is connected to the second end of the outer conductor across a second capacitor.

76. The MRI antenna of claim 73, wherein the second end of the inner conductor is connected to the second end of the outer conductor across a second capacitor.

77. The MRI antenna of claim 76, further comprising:
a variable capacitor connecting the first end of the outer conductor to the second end of the outer conductor;
an output of the antenna is provided from the first and second ends of the inner conductor.

78. The MRI antenna of claim 77, further comprising:
a variable capacitor connecting the first end of the outer conductor to the second end of the outer conductor;
an output of the antenna is provided across the first and second ends of the inner conductor.

79. The MRI antenna of claim 66, wherein the closed circuit is tunable to a frequency.

80. A method of using an antenna in magnetic resonance imaging comprising; providing an, antenna comprising a coaxial cable unit having an inner conductor with first and second ends and an outer conductor with first and second ends proximate the first and second ends of the inner conductor, respectively, the outer conductor being electrically continuous between the first and second ends of the outer conductor, wherein the inner and outer conductors are electrically connected to form a closed circuit including the first and second ends of the inner and outer conductors; and positioning the coaxial cable unit and a body part such that the coaxial cable unit is around the body part.

81. The method of claim 80, wherein the coaxial cable unit is shaped to substantially bound a region to receive a body part, the method comprising:

positioning the coaxial cable unit and the body part such that the body part is within the region.

82. The antenna of claim 80, wherein the outer conductor extends continuously between the first and second ends of the outer conductor.

83. A method of conducting magnetic resonance imaging, comprising:

placing an antenna proximate a body part, the antenna comprising an inner conductor and an outer conductor substantially surrounding the inner conductor, wherein the inner conductor has first and second ends and the outer conductor has first and second ends proximate the first and second ends of the inner conductor, respectively, the outer conductor being electrically continuous between the first and second ends of the outer conductor, the inner conductor being electrically connected to the outer conductor, forming a closed circuit including the first and second ends of the inner and outer conductors; and conducting magnetic resonance imaging of the body part.

84. The method of claim 83, comprising placing the antenna by receiving the body part within a region bounded by the antenna.

85. The antenna of claim 83, wherein the outer conductor extends continuously between the first and second ends of the outer conductor.

86. An MRI receiving antenna, comprising:

a first conductor extending continuously between first and second ends;

a second conductor extending continuously between third and fourth ends, the second conductor substantially surrounding the first conductor, from the first end to the second end of the first conductor;

wherein the ends of the inner conductor are electrically connectable to the ends of the outer conductor, to form a closed circuit including the first and second ends of the inner conductor and the third and fourth ends of the outer conductor; and the antenna further comprising an output from the closed circuit.

87. The antenna of claim 86:

wherein the ends of the inner conductor are electrically connectable to the ends of the outer conductor across at least one capacitor; and the output of the antenna is provided across the capacitor.

* * * * *